United States Patent
Bhasin et al.

(10) Patent No.: US 11,742,045 B2
(45) Date of Patent: *Aug. 29, 2023

(54) TESTING OF COMPARATORS WITHIN A MEMORY SAFETY LOGIC CIRCUIT USING A FAULT ENABLE GENERATION CIRCUIT WITHIN THE MEMORY

(71) Applicant: STMicroelectronics International N.V., Geneva (CH)

(72) Inventors: Rohit Bhasin, New Delhi (IN); Shishir Kumar, Greater Noida (IN); Tanmoy Roy, Greater Noida (IN); Deepak Kumar Bihani, Noida (IN)

(73) Assignee: STMicroelectronics International N.V., Geneva (CH)

( * ) Notice: Subject to any disclaimer, the term of this patent is extended or adjusted under 35 U.S.C. 154(b) by 325 days.

This patent is subject to a terminal disclaimer.

(21) Appl. No.: 17/222,119

(22) Filed: Apr. 5, 2021

(65) Prior Publication Data
US 2021/0225453 A1 Jul. 22, 2021

Related U.S. Application Data

(63) Continuation of application No. 16/702,744, filed on Dec. 4, 2019, now Pat. No. 10,998,077.

(60) Provisional application No. 62/789,573, filed on Jan. 8, 2019.

(51) Int. Cl.
*G11C 29/38* (2006.01)
*G11C 29/14* (2006.01)

(52) U.S. Cl.
CPC ............ *G11C 29/38* (2013.01); *G11C 29/14* (2013.01)

(58) Field of Classification Search
None
See application file for complete search history.

(56) References Cited

U.S. PATENT DOCUMENTS

| 5,920,515 A * | 7/1999 | Shaik ................... | G11C 29/844 365/201 |
| 8,458,545 B2 * | 6/2013 | Roy ...................... | G11C 29/024 714/724 |
| 10,998,077 B2 * | 5/2021 | Bhasin .................. | G11C 29/32 |
| 2004/0001377 A1 * | 1/2004 | Kobayashi ............ | G11C 29/32 365/201 |
| 2009/0154270 A1 * | 6/2009 | Barth, Jr. .............. | G11C 29/24 365/201 |

(Continued)

*Primary Examiner* — April Y Blair
*Assistant Examiner* — Matthew W Wahlin
(74) *Attorney, Agent, or Firm* — CROWE & DUNLEVY (57) ABSTRACT

A decoder decodes a memory address and selectively drives a select line (such as a word line or mux line) of a memory. An encoding circuit encodes the data on select lines to generate an encoded address. The encoded address and the memory address are compared by a comparison circuit to generate a test result signal which is indicative of whether the decoder is operating properly. To test the comparison circuit for proper operation, a subset of an MBIST scan routine causes the encoded address to be blocked from the comparison circuit and a force signal to be applied in its place. A test signal from the scan routine and the force signal are then compared by the comparison circuit, with the test result signal generated from the comparison being indicative of whether the comparison circuit itself is operating properly.

16 Claims, 5 Drawing Sheets

(56) References Cited

U.S. PATENT DOCUMENTS

2009/0158224 A1\* 6/2009 Barth, Jr. .............. G11C 29/72
  716/136
2011/0231717 A1 9/2011 Hur et al.

\* cited by examiner

| AddN(1) | Add(1) | AddN(0) | Add(0) | SL |
|---|---|---|---|---|
| H | L | H | L | 0 |
| H | L | L | H | 1 |
| L | H | H | L | 2 |
| L | H | L | H | 3 |

FIG. 3B
(Prior Art)

| WEN | A5 | A4 | A3 | A2 | A1 | A0 | SELOK expected | Comparator covered |
|---|---|---|---|---|---|---|---|---|
| 0 | 0 | 0 | 0 | 0 | 0 | 1 | 0 | A0 |
| 0 | 0 | 0 | 0 | 0 | 1 | 0 | 0 | A1 |
| 0 | 0 | 0 | 0 | 1 | 0 | 0 | 0 | A2 |
| 0 | 0 | 0 | 1 | 0 | 0 | 0 | 0 | A3 |
| 0 | 0 | 1 | 0 | 0 | 0 | 0 | 0 | A4 |
| 0 | 1 | 0 | 0 | 0 | 0 | 0 | 0 | A5 |
| 1 | 0 | 0 | 0 | 0 | 0 | 0 | 0 | WEN |

TESTING OF COMPARATORS WITHIN A MEMORY SAFETY LOGIC CIRCUIT USING A FAULT ENABLE GENERATION CIRCUIT WITHIN THE MEMORY

CROSS REFERENCE TO RELATED APPLICATIONS

This application is a continuation of U.S. patent application Ser. No. 16/702,744 filed Dec. 4, 2019, which claims priority from United States Provisional Application for Patent No. 62/789,573 filed Jan. 8, 2019, the disclosures of which are incorporated by reference.

TECHNICAL FIELD

The present invention relates generally to testing the memory safety logic of an integrated circuit memory and, in particular, to testing the comparator circuitry of the memory safety logic.

BACKGROUND

Figure 1:
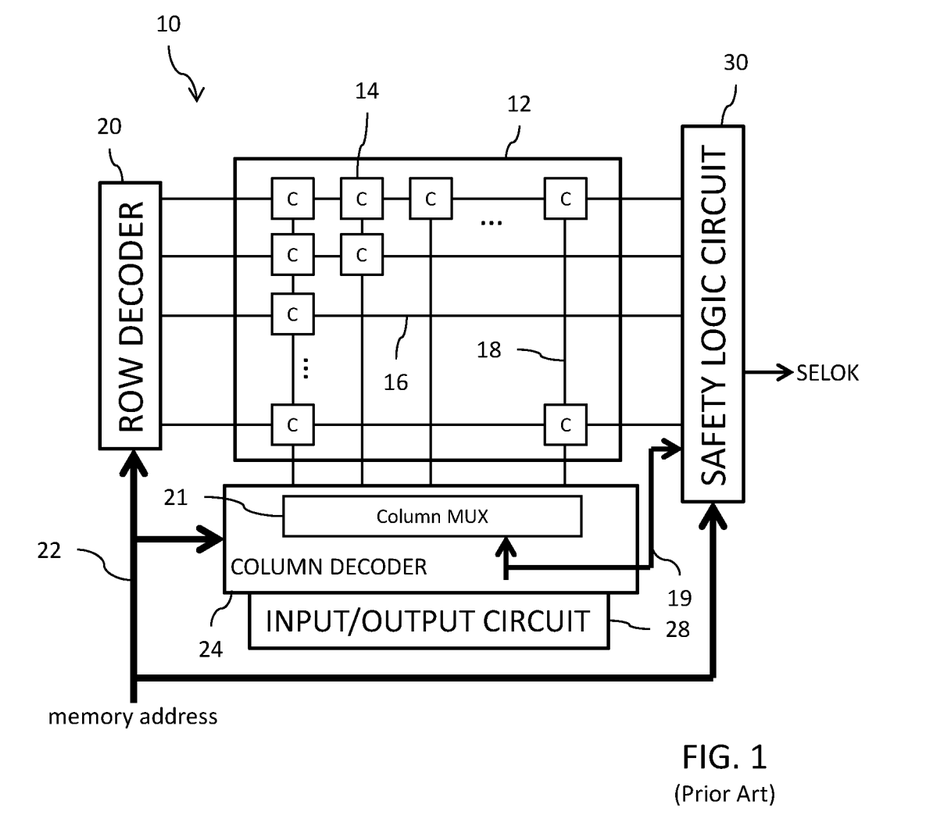
FIG. 1 is a simplified block diagram of an integrated circuit memory.

FIG. 1 shows a simplified block diagram of an integrated circuit memory 10. The memory includes a memory core 12 with an array of memory cells (C) 14 arranged in rows and columns, where rows are associated with word lines 16 and columns are associated bit lines 18. The memory cells 14 may, for example, be static random access memory (SRAM) cells. The word lines 16 are selectively driven by a row decoder 20 that receives a memory address on an address bus 22 and decodes the received address bits (or a subset thereof) of the memory address to select one of the word lines 16 for actuation (for example, to be driven logic high). The memory 10 further includes a column decoder 24 coupled to the address bus 22. The column decoder 24 also receives the memory address on the address bus 22 and decodes the received address bits (or a subset thereof) of the memory address to generate signals on column multiplexer (mux) lines 19 which select a plurality of bit lines 18 to be coupled to an input/output (I/O) circuit 28.

In write mode, write data is applied to the input data lines at the I/O circuit 28 and a memory address is applied to the address bus 22, with the bits of the memory address specifying the location within the memory core 12 where the write data is to be stored. The row decoder 20 and column decoder 24 decode the received address bits of the memory address and select the word line 16 and mux lines 19 (which control column multiplexer 21 operation to select bit lines 18) corresponding to that memory address. A write operation to save the write data in the memory cells 14 at the selected word line 16 and bit lines 18 is then performed.

In read mode, a memory address is applied to the address bus 22, with the bits of the memory address specifying the location within the memory core 12 from where the read data is to be retrieved. The row decoder 20 and column decoder 24 decode the received address bits of the memory address and select the word line 16 and mux lines 19 (which control column multiplexer 21 operation to select bit lines 18) for that memory address. A read operation to retrieve the read data stored in the memory cells 14 at the selected word line 16 and bit lines 18 is then performed and the read data is output to the output data lines by the I/O circuit 28.

The memory 10 further includes safety logic circuit 30 that monitors operations (such as, for example, the write operation or read operation discussed above) performed by the memory 10 and generates an output error flag (SELOK) in response to the detection by the safety logic of a soft or hard fault which could lead to erroneously written or read data. For example, the safety logic circuit 30 monitors the accuracy of the selection made by decoder circuits, such as the row decoder or column decoder, when accessing the memory array 12 and the output error flag (SELOK) may be logic high if the correct selection was made (i.e., no fault is detected) and logic low if the incorrect selection was made (i.e., a fault is detected). More specifically, consider the illustrated example where the safety logic circuit 30 monitors the accuracy of the selection of the word lines 16 by the row decoder 20. In this case, the output error flag (SELOK) may be logic high if the correct word line 16 was selected (i.e., no fault is detected) and logic low if the incorrect word line was selected (i.e., a fault is detected). The safety logic circuit 30 could alternatively, and indeed additionally, monitor the accuracy of the selection of the multiplexer (mux) lines 19 for decoding the selected columns by the column decoder. In this case, the output error flag (SELOK) may be logic high if the correct mux line 19 was selected (i.e., no fault is detected) and logic low if the incorrect mux line was selected (i.e., a fault is detected). The word lines and mux lines are referred to herein more generically as "select lines" 17 of memory 10.

Figure 2:
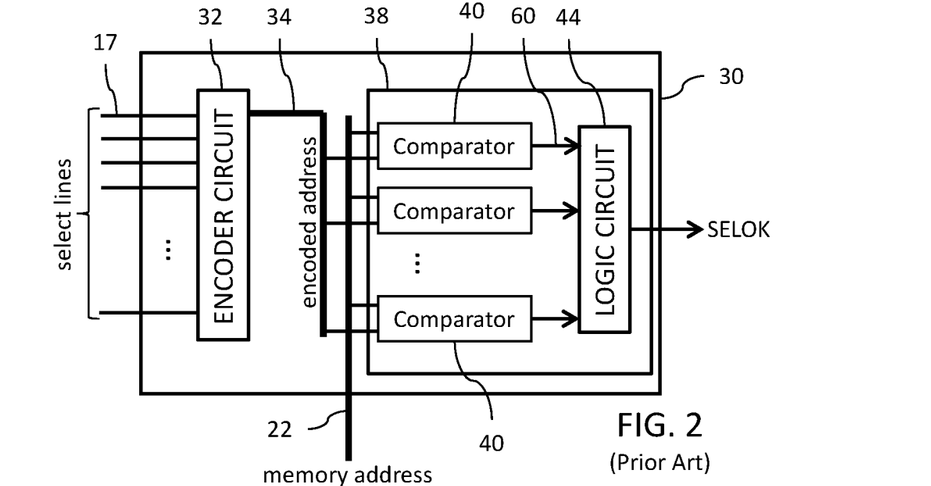
FIG. 2 is a block diagram of a safety logic circuit.

Reference is now made to FIG. 2 which shows a block diagram of the safety logic circuit 30. The safety logic circuit 30 includes an encoder circuit 32 having inputs coupled to the select lines 17 (which may, as noted above, be either word lines 16 or mux lines 19 or both). The encoder circuit 32 operates to encode the data on the select lines 17 to generate an encoded address for output on an encoded address bus 34. A comparison circuit 38 operates to compare the address bits of the encoded address on the encoded address bus 34 to the address bits of the memory address on the address bus 22. The comparison circuit 38 sets the logic state of the error flag (SELOK) in response to the comparison. The error flag (SELOK) may be driven to a first logic state (for example, logic low) if the addresses do not exactly match, this being indicative of the existence of an error by the decoder (either row decoder 20 or column decoder 24) in decoding the memory address and making the selection of the corresponding select line 17.

As an example, the memory may include M select lines 17 (corresponding to the word lines 16 and/or mux lines 19) and the encoded address bus 34 may have N bits, where N is also equal to the number of bits in the memory address on the address bus 22. Thus, the encoder circuit 32 is an M×N encoder. During correct operation of the decoder (such as the row decoder 20 or column decoder 24), only one of the select lines 17 will be asserted (for example, logic high) at a time in response to the decoded memory address on address bus 22. All other select lines 17 will be deasserted (for example, logic low). The encoder circuit 32 operates on the data for all select lines 17 to generate the encoded address on the encoded address bus 34 which should match the memory address if the decoder (20 or 24) is operating correctly.

Figure 3A:
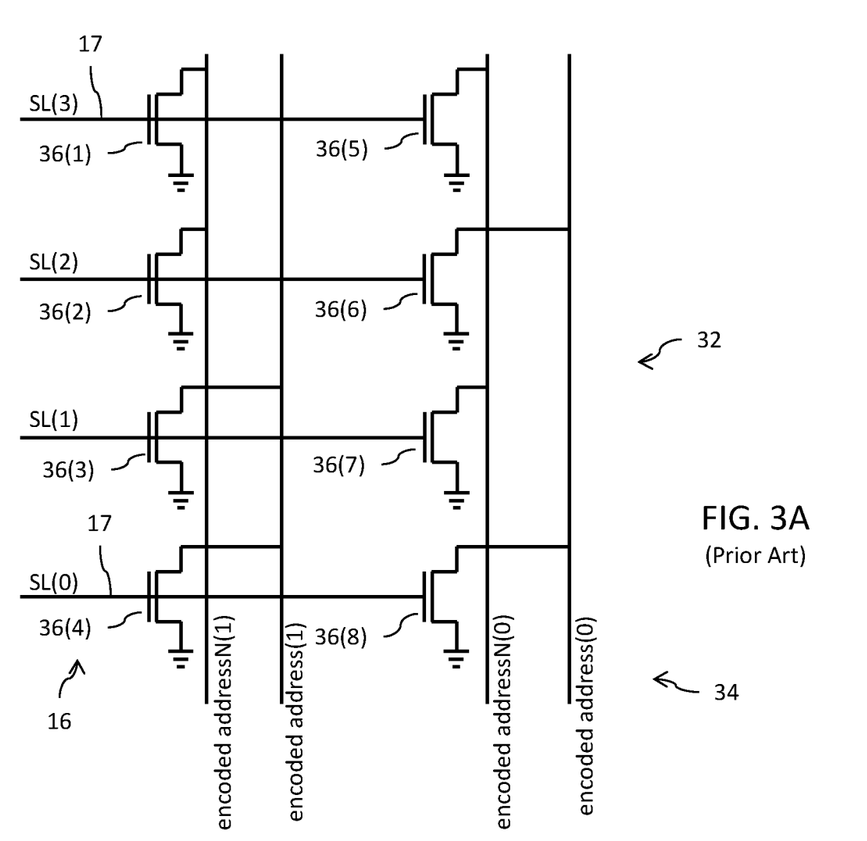
FIG. 3A is a simplified circuit example of an encoder circuit.
Figure 3B:
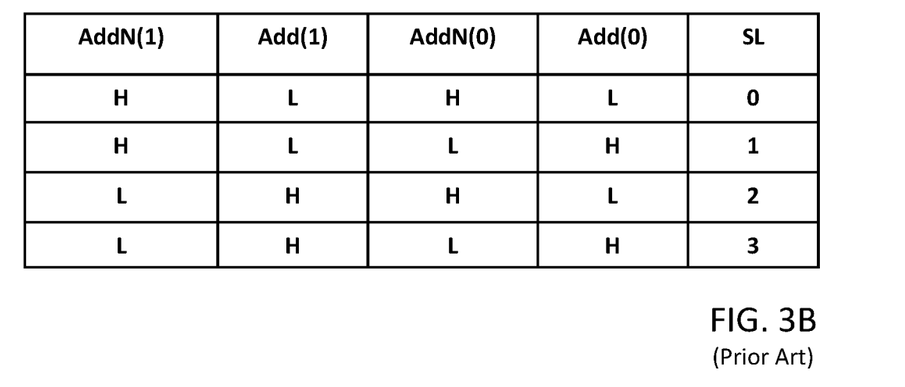
FIG. 3B is a table illustrating the encoding operation.

A simplified circuit example of the encoder circuit 32 is shown in FIG. 3A. In this example the encoder is a 4×2 NOR matrix encoder implemented using n-channel MOSFET devices 36(1)-36(8). For a memory address of <10>, the decoder 20, 24 would decode these memory address bits and assert only the third select line 17 (SL(2)) at logic high. All other select lines 17 would be deasserted at logic low. The encoder circuit 32 would encode this select line 17 data of <0100> to generate an encoded address of <10> because only MOSFET devices 36(2) and 36(6) would be turned on in the encoder by SL(2) at logic high and all other MOSFET devices 36(1), 36(3)-36(5) and 36(7)-36(8) would be turned off. It will be noted that the example circuit implementation of FIG. 3A for the encoder 32 will generate both the encoded address and the complement of the encoded address (referred to as encoded addressN) on the encoded address bus 34. Although use of just the encoded address is a possibility, operation of the safety logic circuit 30 is enhanced if both the encoded address and the complement of the encoded address are processed in the manner disclosed herein. FIG. 3B is a table illustrating the full encoding operation for the example of FIG. 3A (where add=encoded address and addN=encoded addressN).

Those skilled in the art are capable of expanding the 4×2 simplified circuit example of FIG. 3A to form the M×N encoder circuit 32.

Referring once again to FIG. 2, the comparison circuit 38 includes a plurality (for example, N) of bit comparator circuits 40 that operate to perform a bit-by-bit comparison of the true and complement N bits in the encoded address (from the encoded address bus 34) to the N bits in the memory address (from the address bus 22). The output 60 of each bit comparator circuit 40 is asserted (logic high) only when the bit of the true encoded address and the logical invert of the bit of the complement encoded address both match the corresponding bit of the memory address. A logic circuit 44 logically combines the outputs from the bit comparator circuits 40 to generate the error flag (SELOK) which will be asserted (for example, logic high) in the scenario where the bits of the true encoded address and the inverted bits of the complement encoded address match the corresponding bits of the memory address, thus indicating proper operation of the decoder (20 or 24) in the selection of the select line 17 (i.e., the word line 16 or mux line 19).

More specifically, given the implementation of the encoder circuit 32 in the manner shown in FIG. 3A to generate both the encoded address and the complement of the encoded address (encoded addressN), the bit comparator circuits 40 of the comparison circuit 38 perform a bit-by-bit comparison of the N bits in the encoded address (from the encoded address bus 34), the corresponding N bits in the complement of the encoded address (also from the encoded address bus 34) and the corresponding N bits in the memory address (from the address bus 22).

Figure 4:
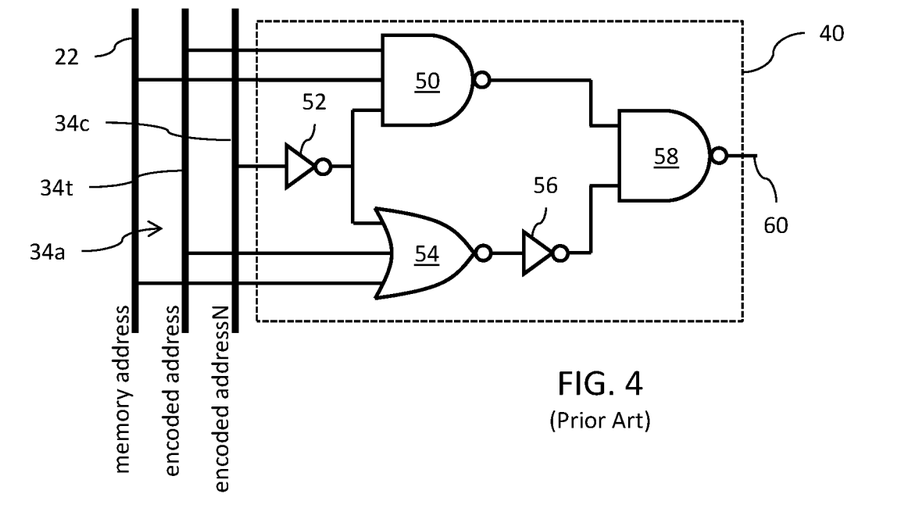
FIG. 4 is a circuit diagram for a bit comparator circuit.

FIG. 4 shows a circuit diagram of an example circuit for each bit comparator circuit 40. The bit comparator circuit 40 includes a logical NAND gate 50 having inputs that receive corresponding single bits of the encoded address (on a true portion of the encoded address bus 34t), the memory address and the logical inversion (by logic inverter 52) of the complement of the encoded address (on a complement portion of the encoded address bus 34c). The bit comparator circuit 40 further includes a logical NOR gate 54 having inputs that receive corresponding single bits of the encoded address, the memory address and the logical inversion (by logic inverter 52) of the complement of the encoded address. The output of the NOR gate 54 is inverted by logic inverter 56. The output of the NAND gate 50 and the output of the inverter 56 are applied to the inputs of a logical NAND gate 58. The output 60 of the bit comparator circuit 40 generated by the NAND gate 58 is asserted (logic high) when there is a match of logic state between the corresponding bits of the encoded address, the complement of the encoded address as inverted by 52, and the memory address.

Figure 5:
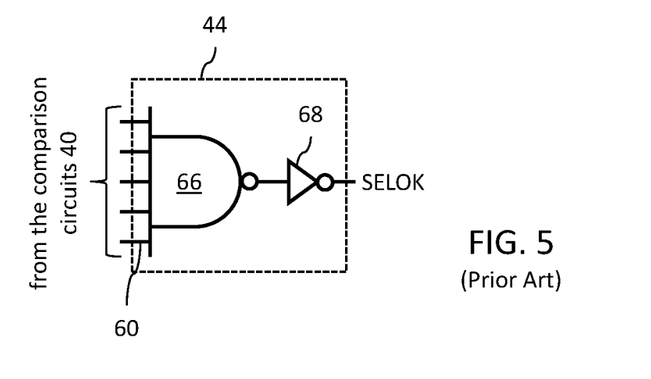
FIG. 5 is a circuit diagram for a logic circuit.

Reference is now made to FIG. 5 which shows a circuit diagram for the logic circuit 44 that logically combines the outputs from the N bit comparator circuits 40 to generate the error flag (SELOK). The logic circuit includes an N-input logic NAND gate 66 coupled to receive the outputs 60 from the N bit comparator circuits 40. The output of the NAND gate 66 is inverted by logic inverter 68 to generate the error flag (SELOK). The error flag (SELOK) is asserted logic high when the outputs 60 from the N bit comparator circuits 40 are all logic high (i.e., this will occur only when the encoded address matches the memory address). The logical operation is essentially a logical ANDing of the outputs 60. In the event of a non-match, indicative of a fault in the decoder 20 or 24, at least one of the outputs 60 from the N bit comparator circuits 40 will be logic low indicating detection of a bit mismatch, and the error flag (SELOK) is deasserted logic low to indicate the presence of the fault.

Memory built-in self-test (MBIST) processing typically scans all addresses by applying an appropriate test vector and checking the error flag (SELOK) in each cycle. However, the MBIST check will not detect faults on the comparator circuit 40 signals (i.e., the signals associated with the outputs of the logic circuitry within the N bit comparator circuits 40 and within the logic circuit 44) that lead to an incorrect assertion logic high of the error flag (SELOK). This is referred to as a stuck-at 1 (stuck-at logic high) situation.

There is a need in the art for an improved testing scheme that can test for and detect faults on the comparator circuit 40 signals through the normal MBIST test scanning operation only.

SUMMARY

In an embodiment, a circuit comprises: a decoder coupled to a memory address bus and configured to receive and decode a memory address to selectively drive a plurality of select lines of a memory; an encoding circuit configured to encode data on said plurality of select lines to generate an encoded address on an encoded address bus; a comparison circuit coupled to the encoded address bus and the memory address bus and configured to compare the encoded address to the memory address and generate a test result signal in response to the comparison which is indicative of whether the decoder is operating properly; a blocking circuit configured to block passage of the encoded address to a portion of the encoded address bus coupled to the comparison circuit in response to a test control signal; and a testing control circuit configured to generate the test control signal and apply a force signal to said portion of the encoded address bus, with said memory address bus configured to receive a test signal provided by a memory built-in self-test (MBIST) scan routine, the force signal and the test signal being configured to the test the comparison circuit so that the test result signal generated by the comparison circuit in response to the comparison is indicative of whether the comparison circuit itself is operating properly.

In an embodiment, a method is provided for testing a safety logic circuit of a memory. The safety logic circuit includes a comparison circuit which operates to compare bits of an encoded address obtained by encoding data on a plurality of select lines of the memory to bits of a memory address for selecting a portion of the memory, said data generated in response to a decoding of the memory address. The method comprises: performing a memory built-in self-test (MBIST) scan routine to test the memory; and in response to a subset of the MBIST scan routine, testing the comparison circuit of the safety logic circuit by: applying a force signal to the comparison circuit in substitution for the encoded address; applying a test signal to the comparison circuit, wherein the test signal is provided by the MBIST scan routine; comparing by the comparison circuit of the force signal to the test signal, wherein the force signal and the test signal are configured to test for proper operation of a bit comparator within the comparison circuit; and generating a test result signal in response to the comparing by the comparison circuit that is indicative of whether said bit comparator of the comparison circuit is operating properly.

In an embodiment, a circuit comprises a memory circuit, a memory built-in self-test (MBIST) circuit configured to test the memory circuit using an MBIST scan routine, and a testing circuit. The memory circuit comprises: a decoder coupled to a memory address bus and configured to receive and decode a memory address to selectively drive a plurality of select lines of the memory circuit; an encoding circuit configured to encode data on said plurality of select lines to generate an encoded address on an encoded address bus; and a comparison circuit coupled to the encoded address bus and the memory address bus and configured to compare the encoded address to the memory address and generate a test result signal in response to the comparison which is indicative of whether the decoder is operating properly. The memory built-in self-test (MBIST) circuit receives the test result signal. The testing circuit comprises: a control circuit operating responsive to a subset of the MBIST scan routine to generate a test control signal and a force signal; and a blocking circuit configured to block passage of the encoded address to a portion of the encoded address bus coupled to the comparison circuit in response to the test control signal; wherein the force signal is applied to said portion of the encoded address bus and a test signal from the subset of the MBIST scan routine is applied to the memory address bus, the force signal and the test signal being configured to the test the comparison circuit, the comparison circuit operating to compare the force signal to the test signal and generate the test result signal indicative of whether the comparison circuit is operating properly.

BRIEF DESCRIPTION OF THE DRAWINGS

For a better understanding of the embodiments, reference will now be made by way of example only to the accompanying figures in which.

DETAILED DESCRIPTION

Figure 6:
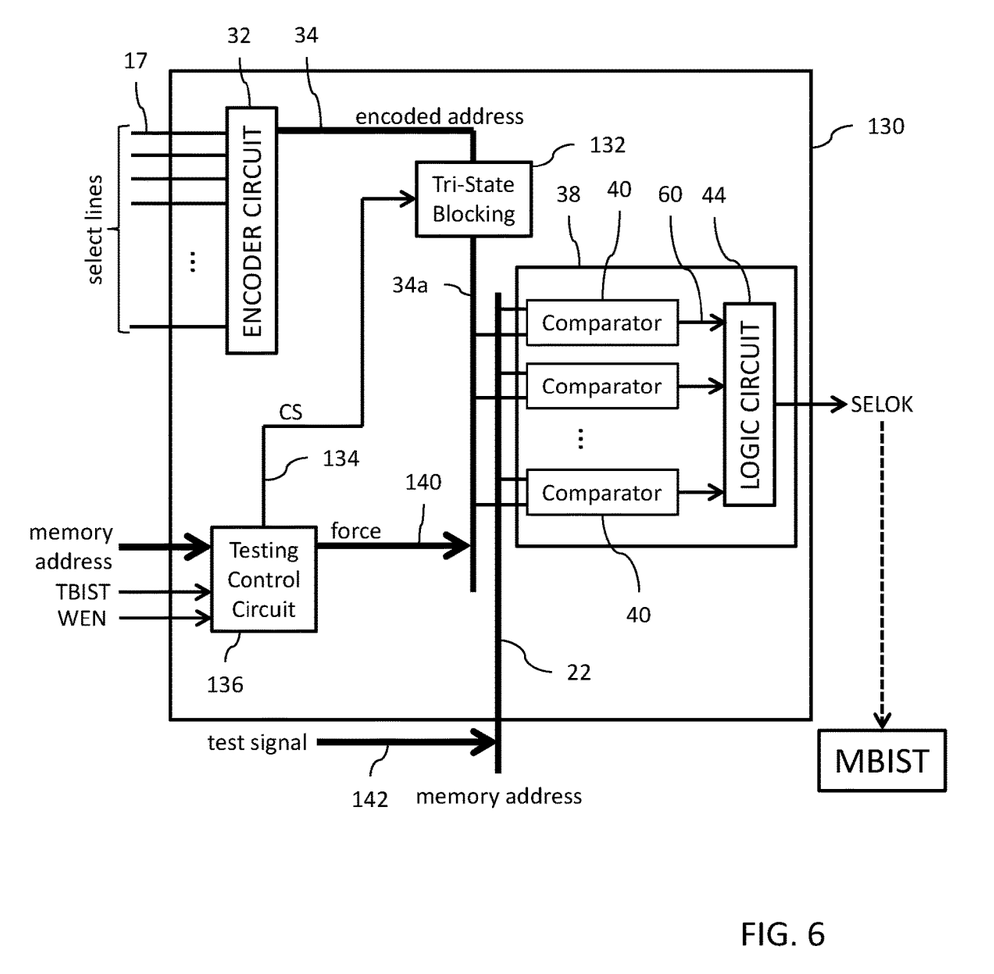
FIG. 6 is a block diagram of a safety logic circuit.

Reference is now made to FIG. 6 which shows a block diagram of a safety logic circuit 130 with enhanced testing functionality. The safety logic circuit 130 can be used in place of the circuit 30 of FIG. 1. Like reference numbers refer to same or similar components, the description of which will not be repeated (see, discussion above).

The safety logic circuit 130 differs from the safety logic circuit 30 generally with respect to the inclusion of a fault enable generation functional testing operation for detecting faults on the comparison circuit 38 signals (i.e., the signals associated with the outputs of the logic circuitry within the bit comparator circuits 40 and within the logic circuit 44) that lead to an incorrect assertion logic high of the error flag (SELOK). This is referred to as a stuck-at fault detection process.

A tri-state blocking circuit 132 is located on the encoded address bus 34 between the encoder circuit 32 and the comparison circuit 38. Operation of the tri-state blocking circuit 132 is controlled by a control signal 134 generated by a fault enable generation testing control circuit 136. When the control signal (CS) 134 is deasserted (for example, logic low), the tri-state blocking circuit 132 is disabled and bits of the encoded address (output from the encoder circuit 32 on the encoded address bus 34) pass through the tri-state blocking circuit 132 to the comparison circuit 38. Conversely, when the control signal 134 is asserted (for example, logic high), the tri-state blocking circuit 132 is enabled so that the bus lines of a portion 34a of the encoded address bus 34 are disconnected from the encoded address bus 34. In this configuration, bits of the encoded address (output from the encoder circuit 32 on the encoded address bus 34) are blocked by the tri-state blocking circuit 132 from passing through to the inputs of the comparison circuit 38.

The control circuit 136 further generates a multi-bit force signal 140 for application to the disconnected portion 34a of the encoded address bus 34. The multi-bit force signal 140 forces all bits of the disconnected portion 34a of the encoded address bus 34 to a known logic state. For example, this could comprise forcing all bits to a logic high state or forcing all bits to a logic low state. In the context of the implementation discussed herein where the encoded address bus 34 carries both the encoded address and the complement of the encoded address (encoded addressN), the multi-bit force signal 140 would include N-bits corresponding to the encoded address where all bits are set to logic low and are applied to the true encoded address bus 34t and N-bits corresponding to the complement of the encoded address where all bits are set to logic high and are applied to the complement encoded address bus 34c. See, FIG. 7. The application of the multi-bit force signal 140 to the disconnected portion 34a of the encoded address bus 34 is made subsequent to the assertion of the control signal 134 which enables the tri-state blocking circuit 132.

The memory built-in self-test (MBIST) for the integrated circuit memory 10 performs typical and well known operations by scanning all memory addresses for read and write and may further operate to check for the assertion of the error flag (SELOK) in every MBIST test cycle.

During the normal scanning operation performed by the MBIST, a scan vector is generated by the MBIST and a subset of that scan vector which includes the memory address and write enable, along with the BIST testing (TBIST) signal, is received by the testing control circuit 136 and processed to enable the fault enable generation functional testing operation on the comparison circuit 38. Thus, a subset of the normal MBIST scan routine is being utilized to activate a test mode for testing whether the comparators 40 of the safety logic circuit 130 are operating properly. Certain MBIST patterns are advantageously re-utilized to check the comparators 40, and as a result MIST coverage is improved in comparison to prior art testing configurations.

As an example, testing is enabled in response to satisfaction of the following Boolean expression relative to the subset of the scan vector:

TBIST*(not(WEN)*ASEL+WEN*not(ASEL)

where: ASEL=A0+A1+A2+A3+ . . . +An. When enabled to perform the fault enable generation functional testing operation, the testing control circuit 136 generates the control signal 134 for enabling the tri-state blocking circuit 132 and generates the multi-bit force signal 140. A multi-bit test signal 142 which is part of the MBIST scan vector can then be applied to the address bus 22. This multi-bit test signal 142 sets one bit (corresponding to a particular one of the N bit comparator circuits 40 to be tested) to a testing logic level (for example, asserted logic high) and the remaining bits (corresponding to the remaining ones of the N bit comparator circuits 40 not to be tested) to the opposite logic level (for example, deasserted logic low).

In the absence of a fault on the comparison circuit 38 signals (i.e., the signals associated with the outputs of the logic circuitry within the N bit comparator circuits 40 and within the logic circuit 44), the error flag (SELOK) will have a first logic state (for example, logic low). Conversely, if there is a fault on the comparison circuit 38 signals, the error flag (SELOK) will have a second logic state (for example, logic high, indicative of a stuck-at logic high fault). The application of the multi-bit test signal 142 to the address bus 22 is made, like with the multi-bit force signal 140, subsequent to the assertion of the control signal 134 which enables the tri-state blocking circuit 132.

As previously noted, the comparison circuit 38 includes a plurality of bit comparator circuits 40, and testing of each individual one of the bit comparator circuits 40 must be performed to ensure proper operation of the comparison circuit 38. This is accomplished by first asserting the control signal 134 to enable the tri-state blocking circuit 132, and then applying a sequence of multi-bit test signals 142 for application to the address bus 22. Each multi-bit test signal 142 in the sequence will have a different single bit set to the testing logic level. For example, with an N-bit address bus 22 and N bit comparator circuits 40, the following sequence of multi-bit test signals 142 can be generated and applied to the address bus 22:

test signal<1>=<000 001>,
test signal<2>=<000 010>,
test signal<3>=<000 100>,
and so on,
test signal<N−1>=<010 000>, and lastly
test signal<N>=<100 000>.

Figure 7:
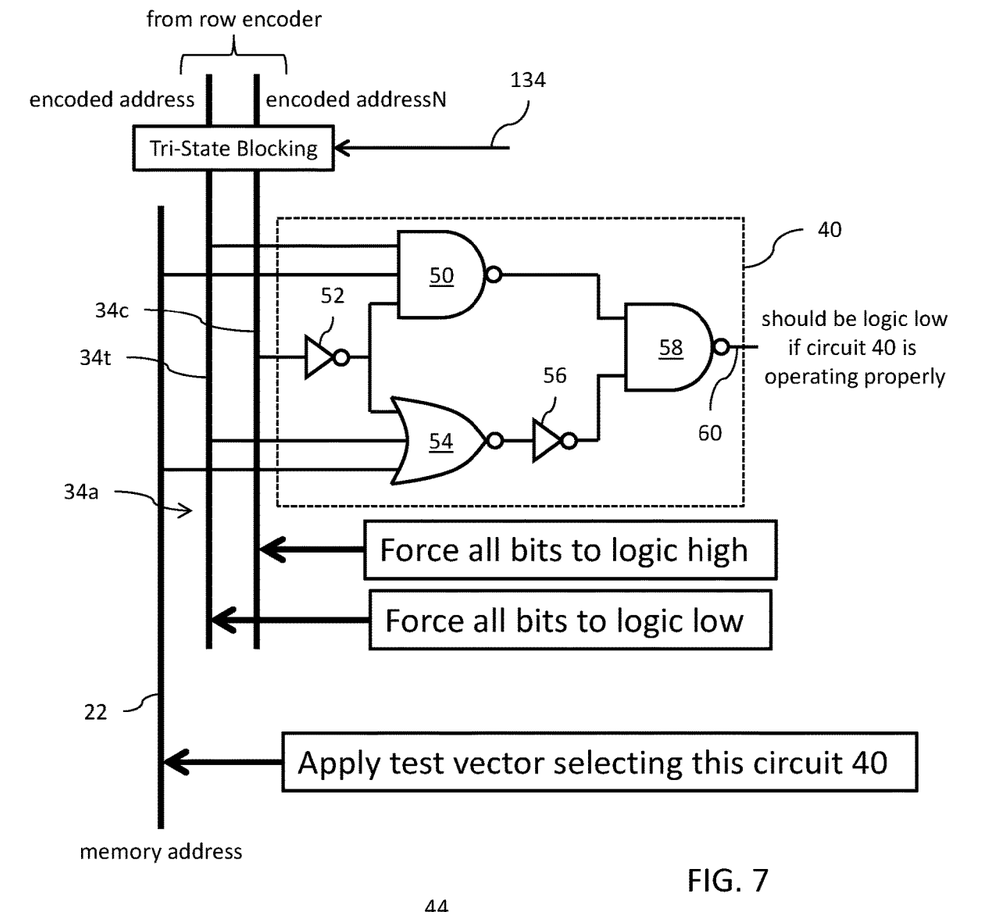
FIG. 7 illustrate an operation of the test.

Considering in more detail the implementation as shown in FIGS. 4 and 7 for testing of the comparison circuit 38, the ones of the N bit comparator circuits 40 which receive a logic low bit from the test signal 142 on the address bus 22 should generate an output 60 that is logic high and the selected one of the N bit comparator circuits 40 which receives a logic high bit from the test signal 142 should generate the output 60 that is logic low. Because at least one of the outputs 60 is logic low, the logic circuit 44 will generate the error flag (SELOK) with the first logic state (logic low) indicating that the selected one of the N bit comparator circuits 40 is functioning properly (i.e., it does not suffer from a stuck-at 1 fault). In connection with the foregoing, consider instead the situation where the selected one of the N bit comparator circuits 40 is not functioning properly (i.e., it suffers from a stuck-at 1 fault). In this case, all of the outputs 60 will be logic high and the logic circuit 44 will generate the error flag (SELOK) with the second logic state (logic high). This logic high output for the error flag (SELOK) is detectable, for example by the MBIST in response to execution of the testing patterns, as an indication that there is a fault in the comparison circuit 38.

The sequence of test signals may further include a test signal where all bits of the address are set to the opposite logic level (for example, deasserted logic low) from the testing logic level and the write enable (WEN) signal is set to the testing logic level. In this case, there is a selection made as to the comparator corresponding to WEN comparison. The expected logic state of the error flag (SELOK) in response to this test signal is still logic low. If a logic low signal is generated, this indicates proper operation of the comparator for the write enable (WEN) signal generation which specifies whether the memory is operating in write mode or read mode.

Figure 8:
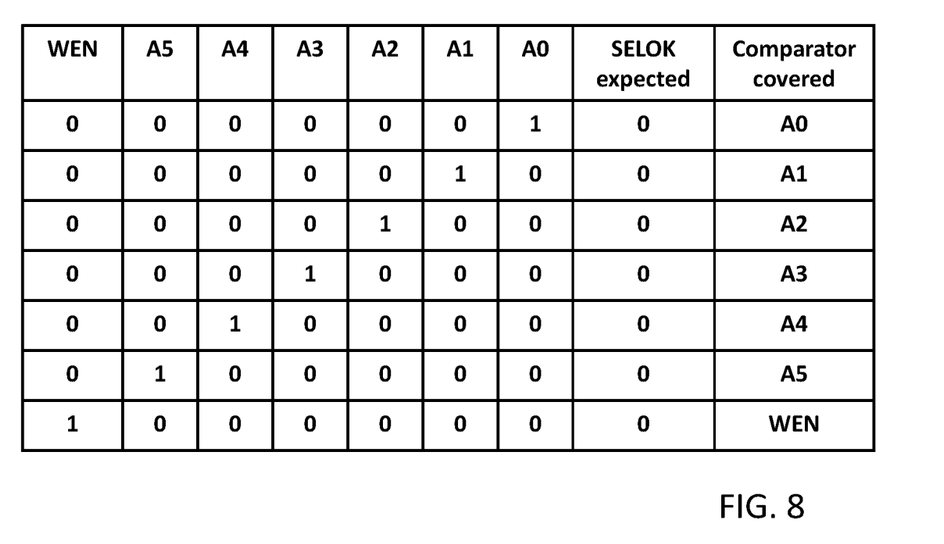
FIG. 8 is a table illustrating the testing operation.

FIG. 8 shows a table illustrating the results of the testing operation for a sequence of test signals in an example where N=6. The references to A0-A5 represent the bits of the address bus 22 to which the test signal is applied and the corresponding logic state values for each of the bits A0-A5 for each test signal in the sequence are shown. The reference to comparator covered indicates that the bit comparator circuit being tested for each test signal is the bit comparator circuit that receives the identified bit on the address bus 22. So, the first test signal of <000001> is configured to test the first bit comparator circuit A0 and the error flag (SELOK) in the logic low state indicates that the first bit comparator circuit A0 is functioning properly.

The testing operation described above is directed, for example, to the detection of incorrect operation each bit comparator circuit 40 due to a stuck-at fault. For example, consider the bit comparator circuit 40 and logic circuit 44 of FIGS. 4 and 5, respectively. If the bit comparator circuit 40 and/or logic circuit 44 has a stuck at logic high fault, it cannot operate, no matter what the individual bit input for the memory address from the address bus 22 and both the encoded address and the complement of the encoded address (encoded addressN) from the encoded address bus 34, to produce an output 60 at the logic low state. The bits of the multi-bit force signal 140 and the multi-bit test signal 142, however, are specifically selected so that a properly operating bit comparator circuit 40 and logic circuit 44 will generate a logic low output 60 (and accordingly produce a logic low error flag (SELOK)). If the error flag (SELOK) does not go to logic low during the testing operation of each selected one of the N bit comparator circuits 40, then it can be determined that either the specific one of the N bit comparator circuit 40 selected by the test signal is faulty or the logic circuit 44 is faulty.

The testing operation disclosed herein operates as an adjunct to the memory built-in self-test (MBIST) for the integrated circuit memory 10. Because of this, there is no need to use external test pins to support the testing operation. The MBIST receives the error flag (SELOK) as an input. In connection with the conventional testing performed by the MBIST on the row decoder 20, the error flag (SELOK) generated by the comparison circuit 38 will be logic high when there is no row decode fault (conversely, logic low in the case of a row decoder fault). However, for the testing of the bit comparator circuits 40 and logic circuit 44, the error flag (SELOK) will be logic low when the selected bit comparator circuit 40 does not have a stuck-at 1 fault (conversely, logic high in the case of a stuck-at fault). In view of this opposite logic state indication of a fault for the two distinct testing operations, some modification of the MBIST is needed in order for the MBIST to recognize the logic high state of the error flag (SELOK) as a fault as a result of the performance of fault testing on the comparison circuit 38.

Figure 9:
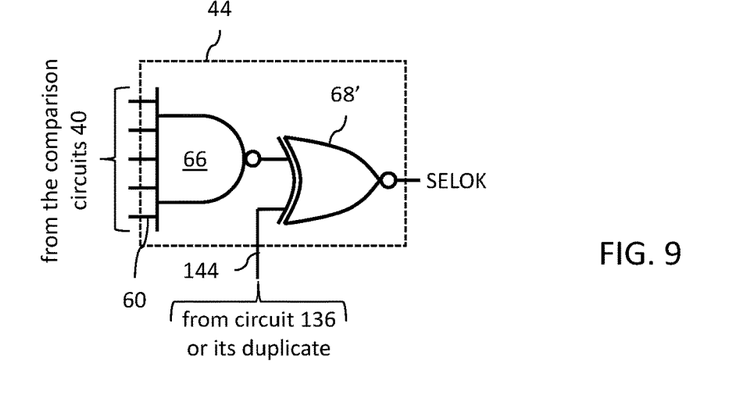
FIG. 9 is a circuit diagram for an alternative embodiment for the logic circuit.

FIG. 9 shows an alternative embodiment of the logic circuit 44 that will cause the error flag (SELOK) to instead have a logic low state indicative of a detected fault when testing for faults in the comparison circuit 38 (bit comparator circuits 40 and logic circuit 44). The FIG. 9 embodiment replaces the inverter circuit 68 with a two input logical XNOR gate 68'. One input of the XNOR gate 68' receives the output of the NAND gate 66 and the other input of the XNOR gate 68' receives a test mode signal 144. In an embodiment, the test mode signal 144 may be derived from one or more of the test control signal 134 and/or the test enable signal (TEN).

When the test mode signal 144 is asserted logic low, indicating that the MBIST is operating to perform testing on the decoder 20 or 24, the logical XNOR gate 68' operates to invert the logic state at the output of the NAND gate 66 to generate the error flag (SELOK). In this situation, where the signal at the output of the NAND gate 66 is logic low when there is no detected fault, the error flag (SELOK) will be logic high where there is no detected fault.

Conversely, when the test mode signal 144 is asserted logic high, indicating that the MBIST is operating to perform testing on the comparison circuit 38, the logical XNOR gate 68' operates to pass the logic state at the output of the NAND gate 66 to generate the error flag (SELOK). In this situation, where the signal at the output of the NAND gate 66 is logic high when there is no detected fault, the error flag (SELOK) will also be logic high where there is no detected fault.

Thus, the MBIST can process the same logic state indications in both testing modes with respect to the detection of fault (i.e., the error flag (SELOK) at logic low indicates a detected fault for either of the testing modes). With this circuit configuration, there is no need to change the operation of the MBIST to recognize the logic low state of the error flag (SELOK) in the comparison circuit 38 testing mode as a fault. In both test modes, a logic low state for the error flag (SELOK) will be indicative of a fault detection.

There is also a possibility that the fault could lie in the control circuit 136 which generates the control signal 134 as well as the multi-bit force signal 140. To account for this possible fault scenario, the other input of the XNOR gate 68' is instead configured to receive the test control signal 134 as generated by a duplicate of the control circuit 136.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An apparatus, comprising:
comparison circuitry including a plurality of comparator circuits and a logic circuit for logically combining outputs of the comparator circuits to generate an output signal;
wherein each comparator circuit is configured to compare a bit of a first bus to a bit of a second bus; and
a testing circuit configured to test the comparator circuits of the comparison circuitry for a stuck-at-1 fault by:
applying a force signal to the first bus, wherein all bits of the force signal have a same logic state;
applying a testing signal to the second bus, wherein one bit of the testing signal has a first logic state and all other bits of the testing signal have a second logic state; and
monitoring for a logic state of the output signal indicative that the comparator circuit which received said one bit of the testing signal having the first logic state is in a stuck-at-1 fault condition.

2. The apparatus of claim 1, further comprising:
an encoder circuit configured to encode a plurality of select signals to generate an encoded address signal;
a blocking circuit configured to selectively pass the encoded address signal to the first bus; and
wherein said testing circuit is configured to actuate the blocking circuit to block passage of the encoded address signal to the first bus during a time period where testing of the comparator circuits of the comparison circuitry is being performed.

3. The apparatus of claim 1, wherein the testing circuit is selectively enabled to perform the test of each comparator circuit of the comparison circuitry in response to a subset of the memory built-in self-test (MBIST) scan routine.

4. The apparatus of claim 3, wherein the logic state of the output signal is monitored by the MBIST.

5. The apparatus of claim 3, wherein the second bus is an address bus, and wherein the plurality of select signals are generated by decoding bits on said address bus.

6. The apparatus of claim 1, wherein the logic circuit operates to logically AND outputs of the comparator circuits.

7. The apparatus of claim 1, wherein the first bus comprises a true bus portion and a complement bus portion, and wherein all bits of the force signal on the true bus portion have one logic state and wherein all bits of the force signal on the complement bus portion have another logic state.

8. The apparatus of claim 7, wherein each comparator circuit comprises:
a first logical NAND gate configured to logically combine a bit of the true bus portion, a complementary bit of the complement bus portion and a bit of the second bus;
a logical NOR gate configured to logically combine said bit of the true bus portion, said complementary bit of the complement bus portion and said bit of the second bus;
an inverter configured to logically invert an output of the logical NOR gate; and
a second logical NAND gate configured to logically combine an output of the first logical NAND gate and an output of the inverter.

9. The apparatus of claim 1, wherein the logic circuit for logically combining outputs of the comparator circuits comprises a logical NAND gate.

10. The apparatus of claim 9, wherein the logic circuit further comprises a logical XNOR gate configured to logically combine an output of the logical NAND gate and a test control signal.

11. An apparatus, comprising:
a comparison circuit coupled to a first bus and a second bus and configured to compare a first address on the first bus to a second address on the second bus and generate a test result signal in response to the comparison;
a testing circuit configured to test the comparison circuit for a stuck-at-1 fault, said testing circuit comprising:
a blocking circuit configured to block the first address from application to the first bus; and a test control circuit configured to apply a force signal to the first bus, with said second bus configured to receive a built-in self-test (BIST) signal, the force signal and the BIST signal being configured to the test the comparison circuit so that the test result signal generated by the comparison circuit in response to the comparison is indicative of whether the comparison circuit suffers from said stuck-at-1 fault.

12. The apparatus of claim 11, wherein the comparison circuit comprises a plurality of bit comparator circuits configured to compare bits of the first bus to corresponding bits of the second bus, and wherein the BIST signal selectively picks one bit comparator circuit of the plurality of bit comparator circuits to be tested for said stuck-at-1 fault.

13. The apparatus of claim 11, wherein the comparison circuit comprises a plurality of bit comparator circuits configured to compare bits of the first bus to corresponding bits of the second bus, and wherein the BIST signal comprises a sequence of test signals, each test signal in the sequence configured to pick a different bit comparator circuit of the plurality of bit comparator circuits to be tested for said stuck-at-1 fault.

14. The apparatus of claim 11, wherein a logic state of the test result signal generated by the comparison circuit indicating a matching of the first address and second address and a logic state of the test result signal generated by the comparison circuit indicating no stuck-at-1 fault are different logic states.

15. The apparatus of claim 11, wherein a logic state of the test result signal generated by the comparison circuit indicating a matching of the first address and second address and a logic state of the test result signal generated by the comparison circuit indicating no stuck-at-1 fault are same logic states.

16. The apparatus of claim 11, wherein the force signal forces all bits of the first bus to a same logic state.

* * * * *